US008847808B1

(12) United States Patent
Chi et al.

(10) Patent No.: US 8,847,808 B1
(45) Date of Patent: Sep. 30, 2014

(54) PROCESS, VOLTAGE, AND TEMPERATURE INSENSITIVE BIASING

(71) Applicant: Broadcom Corporation, Irvine, CA (US)

(72) Inventors: Hongwu Chi, Palo Alto, CA (US); Michael Ming Lee, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/913,752

(22) Filed: Jun. 10, 2013

Related U.S. Application Data (60) Provisional application No. 61/821,083, filed on May 8, 2013.

(51) Int. Cl.
*H03M 1/66* (2006.01)
*H02M 3/155* (2006.01)
*H03M 1/06* (2006.01)

(52) U.S. Cl.
CPC .............. *H03M 1/06* (2013.01); *H02M 3/155* (2013.01)
USPC .......................................... 341/144; 341/135

(58) Field of Classification Search
CPC ............... H03M 2201/6371; H03M 2201/642; H03M 1/06
USPC .......................... 341/144, 155, 143, 140, 135
See application file for complete search history.

(56) References Cited

U.S. PATENT DOCUMENTS

| | | | | |
|---|---|---|---|---|
| 5,661,490 A | * | 8/1997 | McEwan | 342/387 |
| 6,798,843 B1 | * | 9/2004 | Wright et al. | 375/296 |
| 7,603,096 B2 | * | 10/2009 | Chung et al. | 455/262 |
| 7,756,191 B2 | * | 7/2010 | Tran | 375/148 |
| 7,894,789 B2 | * | 2/2011 | Sorrells et al. | 455/313 |
| 8,633,843 B2 | * | 1/2014 | Ceballos et al. | 341/143 |

* cited by examiner

*Primary Examiner* — Peguy Jean Pierre
(74) *Attorney, Agent, or Firm* — Brinks Gilson & Lione (57) ABSTRACT

A biasing circuit facilitates process, temperature, and voltage insensitive operation of a circuit block. The biasing circuit may include a replicate circuit corresponding to the circuit block. The replicate circuit may be a low complexity version of the circuit block that includes selected process, temperature, or voltage sensitive components of the circuit block. The biasing circuit enforces bias conditions on the circuit block that are informed by the response of the replicate circuit to variations in process, temperature, and voltage.

20 Claims, 8 Drawing Sheets

PROCESS, VOLTAGE, AND TEMPERATURE INSENSITIVE BIASING

CROSS REFERENCE TO RELATED APPLICATIONS

This application claims priority to provisional application No. 61/821,083, filed May 8, 2013, titled "Process, Voltage, and Temperature Insensitive Biasing," which is incorporated by reference in its entirety.

TECHNICAL FIELD

This disclosure relates to circuit design, and in particular to biasing designs that help a circuit be less sensitive to the effects of environmental characteristics, such as process, voltage, or temperature.

BACKGROUND

Rapid advances in electronics and communication technologies, driven by immense customer demand, have resulted in the widespread adoption of an immense array of communication devices. Similarly, the communication devices operate according to many different communication protocols, such as the Bluetooth™ protocol. Improvements in circuit design for such devices will facilitate continued widespread adoption of communication devices.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Figure 1:
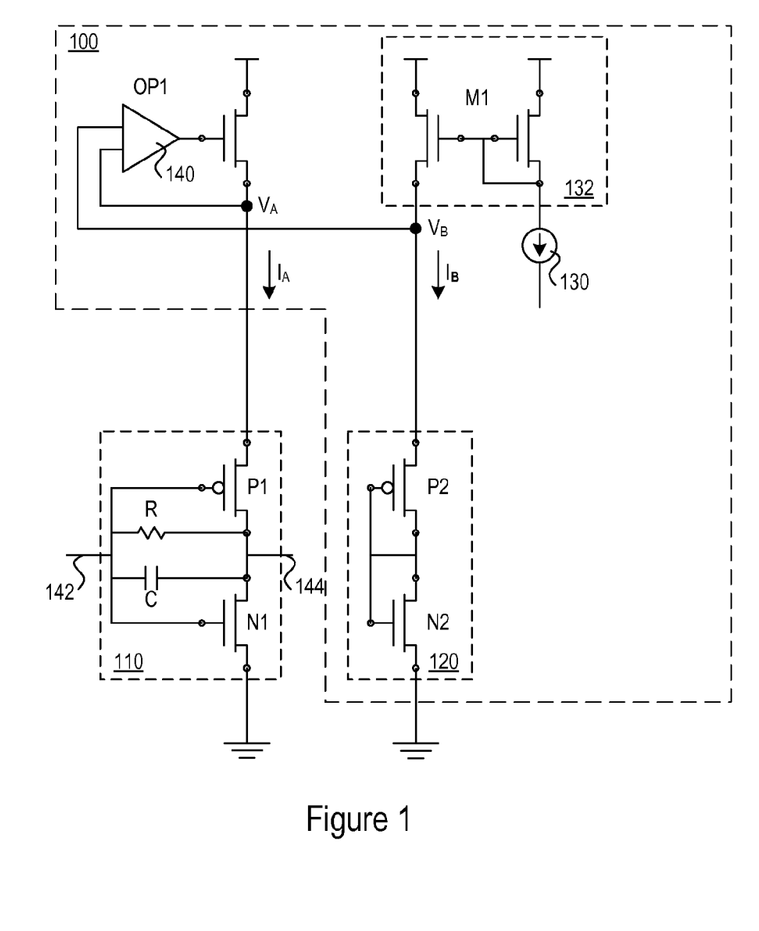
FIG. 1 shows an example of a biasing circuit for a circuit block.

FIG. 1 shows an example of a biasing circuit 100 that may provide reduced sensitivity to one or more of process (P), voltage (V), temperature (T), or other variables. The biasing circuit 100 facilitates consistent circuit operation given process variation, e.g., fabrication variations for the same types of transistors in a circuit; voltage changes, e.g., voltage variation while the circuit operates; and temperature variation, e.g., temperature increases and decreases as the circuit operates. In FIG. 1, the biasing circuit 100 facilitates the consistent operation of a circuit block 110 that may be subject to PVT variations.

The biasing circuit 100 includes a replicate circuit 120, a current source 130, a current mirror 132, and an operational amplifier 140. As described in greater detail below, the biasing circuit 100 may control, enforce, and/or apply bias conditions to the circuit block 110 to facilitate operation of the circuit block 110 according to predefined performance criteria for the circuit block 110. Bias conditions may include a supply voltage, supply current, or both.

The circuit block 110 may take any number of forms. The circuit block 110 may include complementary metal-oxide semiconductor (CMOS) transistors, resistors, capacitors, inductors, and other circuit components. The operational characteristics of PMOS and NMOS transistors vary, sometimes strongly, with variations in PVT. If the operational characteristics are not accounted for, the circuit block 110 may produce outputs that are not ideal for the circuit application. For example, a circuit block that implements a low pass filter may exhibit non-linearities that become worse as temperature increases. The non-linearities can cause, among other things, out of band spectral noise that reduces receiver sensitivity or that causes interference in adjacent communication bands. As another example, the circuit block 110 may take the form of an inverter-based analog circuit. Operation of CMOS inverters may be susceptible to variations in PVT, and particularly the supply current to the CMOS inverter. Accordingly, the performance of inverter-based analog circuits may thus be influenced or degraded according to such PVT variations.

A specific example of a circuit block 110 is given below and shown in FIGS. 1 and 2: a resistor-capacitor (RC) low pass filter (LPF) actively driven by an inverter formed by the PMOS transistor P1 and the NMOS transistor N1. The filter input 142 and the filter output 144 are also shown. As additional examples, the circuit block 110 may be a complex multi-order inverter-based LPF, a buffer implemented with one or more inverters, a multiplier, a sample-and-hold circuit, or a switched current circuit. Other circuit blocks 110, including inverter based circuit blocks, may be implemented.

The biasing circuit 100 may enforce bias conditions applied to the circuit block 110. For example, the biasing circuit 100 may apply a PVT insensitive bias voltage and/or bias current to the circuit block 100. In FIG. 1, the biasing circuit 100 facilitates application of a target bias current $I_A$ to the circuit block 110.

The biasing circuit 100 includes a replicate circuit 120. The replicate circuit 120 may reproduce one or more circuit elements (e.g., the PVT sensitive transistors) of the circuit block 110. As described in greater detail below, the replicate circuit 120 may be implemented to create a current flow through the replicate circuit 120 that is proportional in amount to the current flowing through the circuit block 110 or portions thereof.

To illustrate, and as shown in FIG. 1, the replicate circuit 120 reproduces the PMOS transistor P1, as P2, and reproduces the NMOS transistor N1, as N2, as well as the circuit connections between the transistor gates and output. However, the replicate circuit 120 omits the resistors R and capacitor C. The replicate circuit 120 may omit these (and other) devices due to their relative PVT insensitivity or due to their lack of impact on DC current passing through the PMOS transistor P2 and NMOS transistor N2. In other words, the replicate circuit 120 may reproduce, from the circuit block 110, components and their configuration that are influenced more than a selection threshold amount by PVT variation or current impact.

In this example, the replicate circuit 120 may be a unit cell of the inverter used in the circuit block 110. The replicate circuit 120 may share any number of common or proportional device characteristics with the inverters (and transistors implementing the inverters) included in the circuit block 110.

That is, the replicate circuit 120 may be characterized by proportional transistor size or size ratio, e.g., width/length ratio (w/I ratio), with some or all of the transistors in the circuit block 110. For example, the transistor section P2-N2 of the replicate circuit 120 may be implemented such that the width/length ratio of the transistor section P2-N2 is proportionally smaller, the same, or larger than the width/length ratio of the transistor section P1-N1 in the circuit block 110. As the w/I ratio of a transistor section may characterize the current flow through the transistor section, the proportion between the w/I ratio of the replicate circuit 120 to the w/I ratio of one or more transistor sections of the circuit block 110 may be indicative of the proportion of current that flows through the replicate circuit 120 and each of the one or more transistor sections of the circuit block 110.

The biasing circuit 100 may control the amount of current that flows through the circuit block 110 and the replicate circuit 120. For example, the current source 130 may generate a selected current that flows through a first transistor in the current mirror 132. The second transistor in the current mirror 132 generates the mirror current $I_B$, according to the geometry of the second transistor (e.g., width and length) relative to the first transistor. The mirror current flows through the replicate circuit 120, and the voltage $V_B$ is present at the replicate circuit 120. The op amp 140 may operate to force current through the circuit block 110 such that the voltages $V_A$ and $V_B$ are equal.

In this scenario, the op amp 140 will specific the target current $I_A$ flowing through the circuit block 110 to be proportional to $I_B$ based on the proportion of the w/I ratio of the transistor section P1-N1 of the circuit block 110 to the w/I ratio of the transistor section P2-N2 of the replicate circuit. As one illustrative example, the w/I ratio of the transistor section P2-N2 of the replicate circuit 120 may be five times smaller than the w/I ratio of the transistor section P1-N1 of the circuit block 110. The current source 130 may provide a current such that the mirrored current $I_B$ has a value of 1 micro amp, for example, generating a particular voltage $V_B$ over the replicate circuit 120. The op amp 140 will force the target current $I_A$ such that the voltage $V_A$ is equal to $V_B$. To do so, the op amp 140 provides a target current $I_A$ of 5*1 micro amp=5 micro amps to the circuit block 110, based on the proportion of the respective w/I ratios of the circuit block 110 and the replicate circuit 120. Accordingly, using the replicate circuit 120, current source 130, current mirroring logic 132, and op amp 140, the biasing circuit 100 may control the voltage $V_A$, and consequently target current $I_A$ as well. That is, the biasing circuit 100 may provide target bias current $I_A$ to the circuit block 110 regardless of the associated PVT conditions of the circuit block 110. The biasing circuit 100 may provide a target current of $I_A$ to the circuit block 110 by providing a current source 130 that results in a mirror current $I_B$ which has a value of 1/n of the target current $I_A$, where 'n' is the respective proportion of the w/I ratio for transistor(s) of the circuit block 110 to transistor(s) of the replicate circuit 120.

Any number of components from the logic block 110 may be included as part of the replicate circuit 120. In some implementations, the replicate circuit 120 may replicate any portion of the circuit block 110 that affects the amount of direct current that flows through the circuit block 110. The replicate circuit 120 may omit, e.g., operate without, portions of the circuit block 110 that have less than a predetermined threshold amount of effect on the direct current or are not influenced by PVT flowing through the circuit block 110. For example, some resistors, capacitors, or inductors of a circuit block 110 may not impact the current flow of the circuit block 110. Accordingly, the replicate circuit 120 may omit such devices, while still providing a current flow $I_B$ proportional to the target current $I_A$ supplied to the circuit block 110. One result is that the replicate circuit 120 consumes less space on an integrated circuit (IC) than the circuit block 110.

FIG. 1 presents one example of a replicate circuit 120 as a single PMOS P2 and NMOS N2 transistor pair, which may be the minimum sufficient structure that can replicate the current of the inverter-based analog circuit 110 in a particular proportion. The replicate circuit 120 shown in FIG. 1 may also reduce current consumption, as the current source 130 need only provide a current $I_B$ with a value of 1/n of the target current $I_A$ (or other respective current amount that is mirrored by the current mirror 132 to be $I_B$), whereas alternative replicate circuits 120 additional transistor sections require providing a greater current amount to set the $V_B$.

The biasing circuit 100 may be implemented such that the target current $I_A$ satisfies one or more performance criteria of the circuit block 110. For instance, the circuit block 110 may require a particular degree of linearity for one or more included inverters or tolerate a particular threshold non-linearity. The performance characteristics of the circuit block 110 may be determined according to a particular function of the circuit block 110, and tolerance of linearity variance may vary depending on a particular application or use associated with the circuit block 110.

Linearity requirements of the circuit block 110 may be specified in various ways or according to various performance criteria. When the circuit block 110 is a filter, for example, the performance criteria may be filter linearity or out-of-band noise spectrum. Filter linearity criteria may include meeting a particular level of linearity, such as associated linearity slope for the filter or tolerated variance from an ideal linear filter. Out-of-band noise spectrum criteria may include out-of-band noise being below a predetermined amount. Bias conditions (e.g., supply voltage or target current $I_A$) supporting such linearity requirements may be determined through simulations, including through computer simulation models predicting operation of a particular circuit block 110 under various operating conditions. Thus, through various simulations, the supply voltage and/or target current $I_A$ that meets the particular linearity requirements for a particular circuit block 110 can be obtained, and the current source 130 may be implemented to provide a current $I_B$ that results in the biasing circuit 100 providing the target current $I_A$ to the circuit block 110. For example, the target current $I_A$ may be the minimum current required to meet the linearity requirements of the circuit block 110 across any or all of the process corners, for a particular temperature or voltage range, or according to any additional or alternative combination operating conditions.

Figure 2:
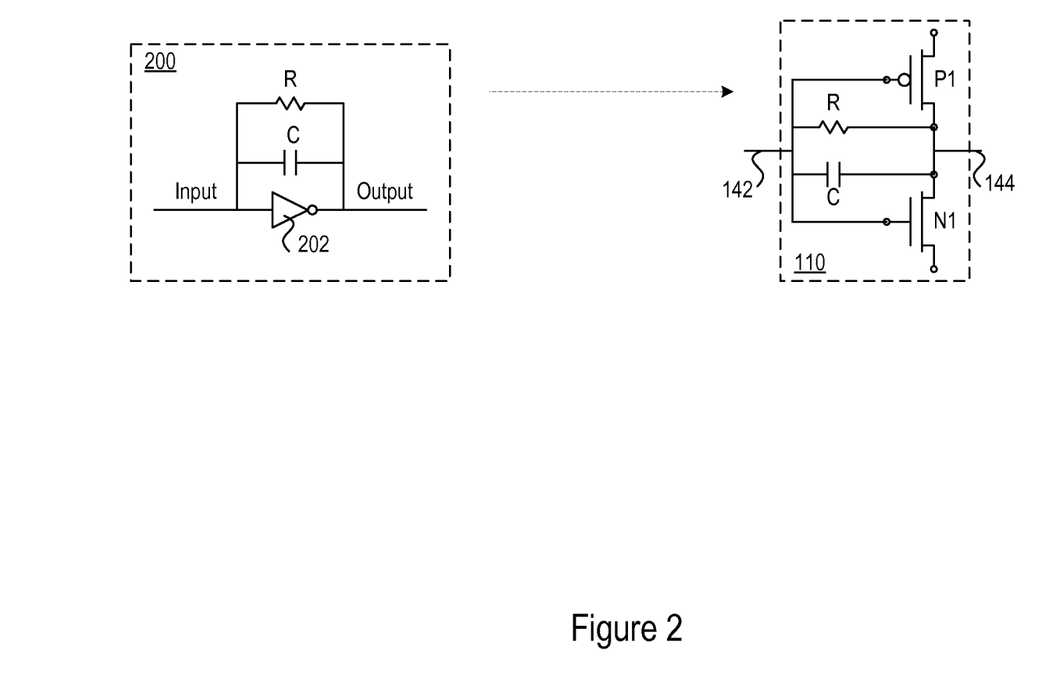
FIG. 2 shows an example of an inverter based resistor-capacitor (RC) low pass filter.

FIG. 2 shows an example of an inverter based resistor-capacitor (RC) low pass filter (LPF) 200. The LPF 200 was used as the example circuit block 110 in FIG. 1. The LPF 200 includes a resistor labeled as R, a capacitor labeled as C, and an inverter 202. The respective values of the resistor R and the capacitor C may be predetermined according to particular filtering bandwidth parameters or other specific operational parameters of the LPF 200.

In operation, the performance of the LPF 200, such as the filtering bandwidth, linearity, current consumption, etc., varies depending on the operating conditions of the inverter 202. As such, the biasing circuit 100 may enforce particular biasing conditions for the LPF 200. The inverter 202 may be implemented with the PMOS transistor P1 and the NMOS transistor N1. The biasing circuit 100 may provide a target current $I_A$ to the LPF 200 according to one or more linearity requirements associated with the LPF 200 and obtained through simulation.

As one exemplary application, the LPF 200 may be used as part of a transmitter of a communication device. The linearity requirements of the LPF 200 may vary depending on a particular communication technique, protocol, topology, or other communication factor associated with the transmitter. As a specific example, the LPF may operate to filter a baseband signal for a Bluetooth transmitter. The linearity requirements of the LPF 200 may thus be determined to meet one or more Bluetooth transmission standards and/or other communication requirements, such as minimizing out-of-band noise, a particular level of cutoff in frequency response, etc. Through simulations at different operating conditions, the current source 130 of a biasing circuit 100 may be set to ensure a target current $I_A$ meeting the linearity requirements of the LPF 200 are satisfied.

One exemplary linearity requirement determination for the LPF 200 is presented next. The linearity requirement for the LPF 200 may be specified such that the LPF 200 does not distort an input signal beyond a particular level or amount. One method for measuring how the LPF 200 affects an input signal is to inject a sinusoidal voltage signal to the LFP 200 and measure higher order harmonics at the output of the LPF 200, for example the third and/or fifth order harmonics which may be referred to as HD3 and HD5 respectively. The linearity requirement of the LPF 200 may be determined or specified based on the output (e.g., distortion) level of the HD3 and HD5 of the output signal. Through such experimentation, a target current $I_A$ that minimizes distortion in the HD3 and HD5 of the output signal to a particular threshold distortion level may be determined. As one example, the target current $I_A$ may be determined such that the HD3 distortion value of the output signal is less than −40 decibels relative to carrier (dBc) and the HD5 distortion value of the output signal is less than −60 dBc. In one implementation, the target current $I_A$ may be determined to be approximately 0.8 milliamperes (mA) when the power supply of the LPF 200 is 1.2 volts (V) to meet the specified linearity requirements.

By utilizing an inverter-based LPF 200, as opposed to an op-amp based low pass filter, current consumption and IC complexity may be reduced. That is, a CMOS inverter may consume less current and occupy less IC space compared to other LPF design alternatives, including op-amp based designs. For example, an op-amp based low pass filter design may require multiple (e.g., two) high speed op-amps. In contrast, the inverter-based LPF 200 and biasing circuit 100 may provide low pass filter functionality with a single op-amp, e.g. the op-amp 140. Moreover, the op-amp 140 may be a lower speed op-amp than the high speed op-amps used to implement an op-amp based low pass filter.

Figure 3:
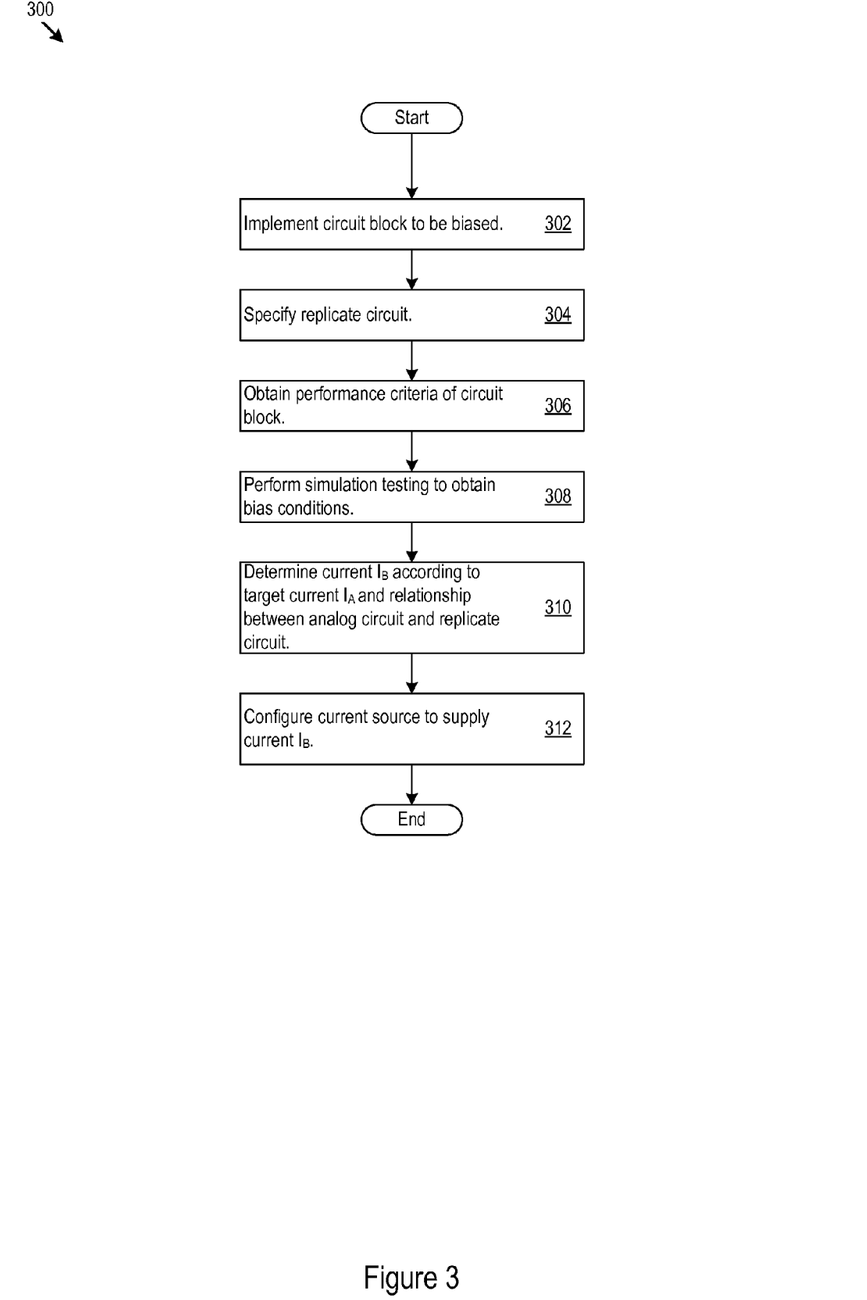
FIG. 3 shows an exemplary process for establishing and operating a biasing circuit.

FIG. 3 shows an exemplary process 300 for biasing a circuit block. For example, the exemplary process 300 may be performed to implement a biasing circuit 100 for a particular circuit block 110, as well as to carry out the biasing itself.

To implement the biasing circuit 100, the particular circuit block 110 is implemented (302). The circuit block 110 may be implemented using one or more transistor sections (e.g., a PMOS-NMOS transistor section forming an inverter) of a particular characteristic, transistor size, or w/I ratio. A replicate circuit 120 may be specified (304) that includes all or part of the circuit block 110. In that regard, the replicate circuit 120 may comprise a transistor section that has characteristics, transistor size, and/or w/I ratio that is proportionally less than the transistor sections of the circuit block 110. For example, the w/I ratio of a transistor section in the replicate circuit 120 may be four to sixteen times smaller than the corresponding w/I ratio of transistor sections in the circuit block 110. The replicate circuit 120 provides a low complexity current or PVT reference for the circuit block 110, and consumes a proportional amount of current with respect to the circuit block 110. The replicate circuit 120 may be included in the biasing circuit 100, and a selected reference current may flow through the replicate circuit 120.

One or more performance requirements for the circuit block 110 are obtained (306). The requirements may vary depending on a particular device, application, or use of the circuit block 110. As examples, performance criteria may be determined according to communication standards associated with use of the circuit block 110. Other explicit requirements may be specified according to particular device specifications, quality control metrics, linearity variances, error tolerances, client or other external specs, desired processing capabilities, or according to any number of additional or alternative requirement sources. Simulation testing is performed to determine bias conditions of the particular circuit block 110 that meet one or more of performance requirements (308). The bias conditions may be selected such that the circuit block 110 meets the performance requirements under a range of conditions. The bias conditions may include a target current $I_A$ and/or target supply voltage such that the performance requirements are met for a particular set of device operating conditions, e.g., temperature range, set or subset of process corners, voltage range, power variance, or according to any number of other operation conditions.

Upon obtaining a target bias current $I_A$ that meets the performance requirements of the circuit block 110, a current $I_B$ to supply to the replicate circuit 120 may be determined based on the relationship between the circuit block 110 and replicate circuit 120 (310), e.g., as described above. Accordingly, a current source 130 may be configured to provide the determined mirror current $I_B$ (312) that causes the biasing circuit 100 to provide the target current $I_A$ to the circuit block 110. The remaining biasing logic, such as the current mirror 132 and op amp 140, may be implemented and the above-described elements may be formed, e.g., on an IC, to implement the biasing circuit 100.

Figure 4:
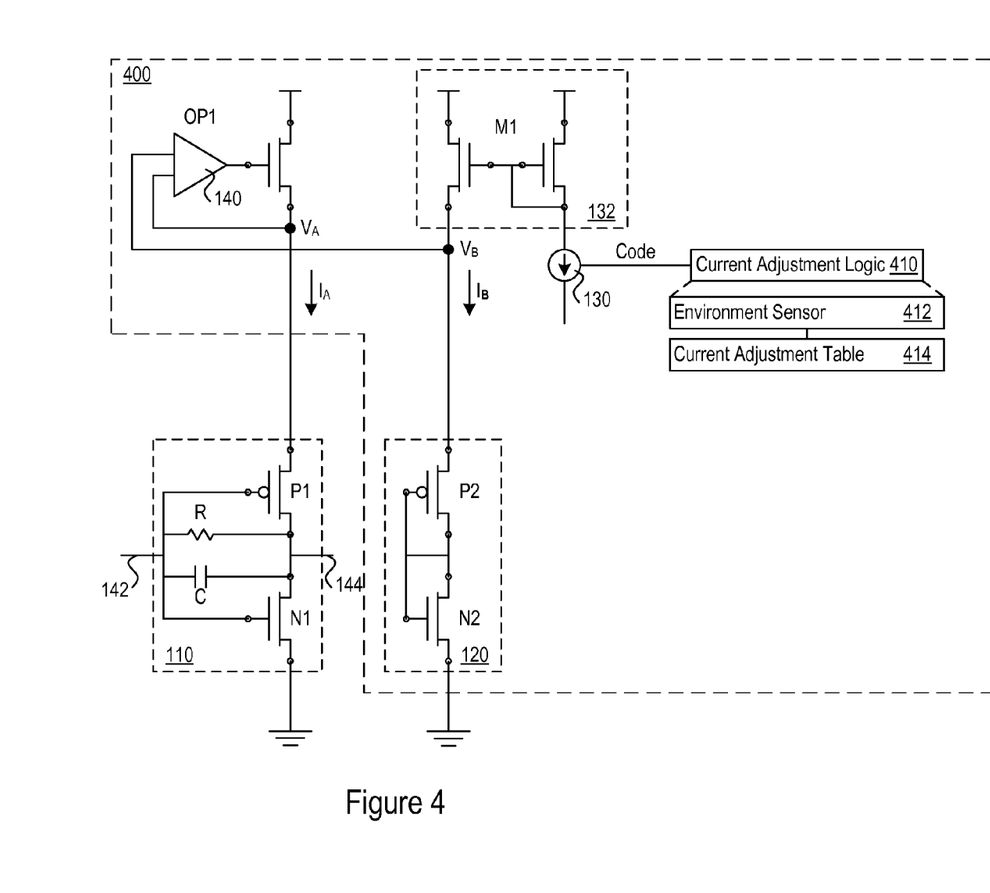
FIG. 4 shows another example of a biasing circuit.

FIG. 4 shows another example of a biasing circuit 400 for biasing a circuit block 110. The biasing circuit 400 includes current adjustment logic 410 in communication with the current source 130. The current adjustment logic 410 operates to adjust the current $I_B$ provided by the current source 130, e.g., by providing a current adjustment code word to the current source 130. In some implementations, the current adjustment logic 410 is implemented using digital logic, and may include one or more processors and a memory storing executable current adjustment instructions.

In one implementation, the current adjustment logic 410 adjusts the current $I_B$ provided by the current source 130 according to a variation in simulated or actual operation of the circuit block 110. Actual operation of the circuit block 110 may be measured upon fabrication of the biasing circuit 100, and a comparison with simulated operation data may reveal inconsistencies. These inconsistencies, e.g., differences in actual linearity or out-of-band spectral emissions may reveal the circuit block 110 fails to meet one or more performance requirements even though the biasing circuit 400 provides a previously determined target current $I_A$ to the circuit block 110. In this case, the current adjustment logic 410 may specify a current adjustment factor or adjustment amount to ensure that the bias conditions, including an adjusted target current $I_A$, are provided such that the circuit block 110 meets the performance requirements. The current adjustment logic

410 may configure or update the current source 130 to increase or decrease the provided current $I_B$ according to a specified adjustment factor or adjustment amount. The adjustment factor may be input by an operator, user, or administrator of the biasing circuit 400, for example. As another example, the current adjustment logic 410 may receive a software or other type of update indicative of the current adjustment factor.

Additionally or alternatively, the current adjustment logic 410 adjusts the current $I_B$ supplied by the current source 130 according to or in response to one or more changes in operating conditions of any portion of the PVT insensitive biasing device 400, including the circuit block 110. For example, the current adjustment logic 410 may adjust the current $I_B$ supplied by the current source 130, and accordingly the target current $I_A$ supplied to the circuit block 110 when the change in operating condition causes the circuit block 110 to fail one or more performance requirements. In some implementations, the currently adjustment logic 410 includes an environment sensor 412 and a current adjustment table 414. The environment sensor 412 may detect or measure any number of operating conditions of the biasing circuit 400, a device implementing the biasing circuit 400, any portion of the circuit block 110. For example, the environment sensor 412 may detect a temperature, voltage, process corner that the biasing circuit 400 is operating in, power, or other operating conditions. The environment sensor 412 may detect current operating conditions or conditions over a particular period of time (e.g., the previous 2 seconds or any other configurable time period).

In response to one or more changes in operating conditions, the current adjustment logic 410 may adjust the current $I_B$ supplied by the current source 130 by accessing the current adjustment table 414. The current adjustment table 414 may specify a target current $I_A$ and/or a particular current $I_B$ to supply for a particular set of operating conditions, e.g., for a particular process corner, particular voltage, and particular temperature. The current adjustment logic 410 may adjust the current supplied by the current source 130 according to the particular entry in the current adjustment table 414 corresponding to the detected operating conditions.

The current adjustment table 414 may be populated through simulation testing, which may include simulating the performance of the circuit block 110 according to each variant of operating conditions to determine bias conditions that meet the performance requirements of the circuit block 110 for the particular operating condition. Thus, the biasing circuit 400 may flexibly and dynamically maintain bias conditions for the circuit block 110 to ensure satisfaction of performance, e.g., linearity, requirements when operating conditions of the circuit block 110 change or vary. In some implementations, the current adjustment table 414 may also be populated and/or updated according to actual operation of the circuit block 110, such as when simulated operation and actual operation of the circuit block 110 as described above. In this case, the current adjustment logic 410 may update the current adjustment table 414 to reflect an updated current $I_B$ value for a particular set of operating conditions, for example, which may be received through operator input, as a software update, or in any number of additional or alternative ways.

Figure 5:
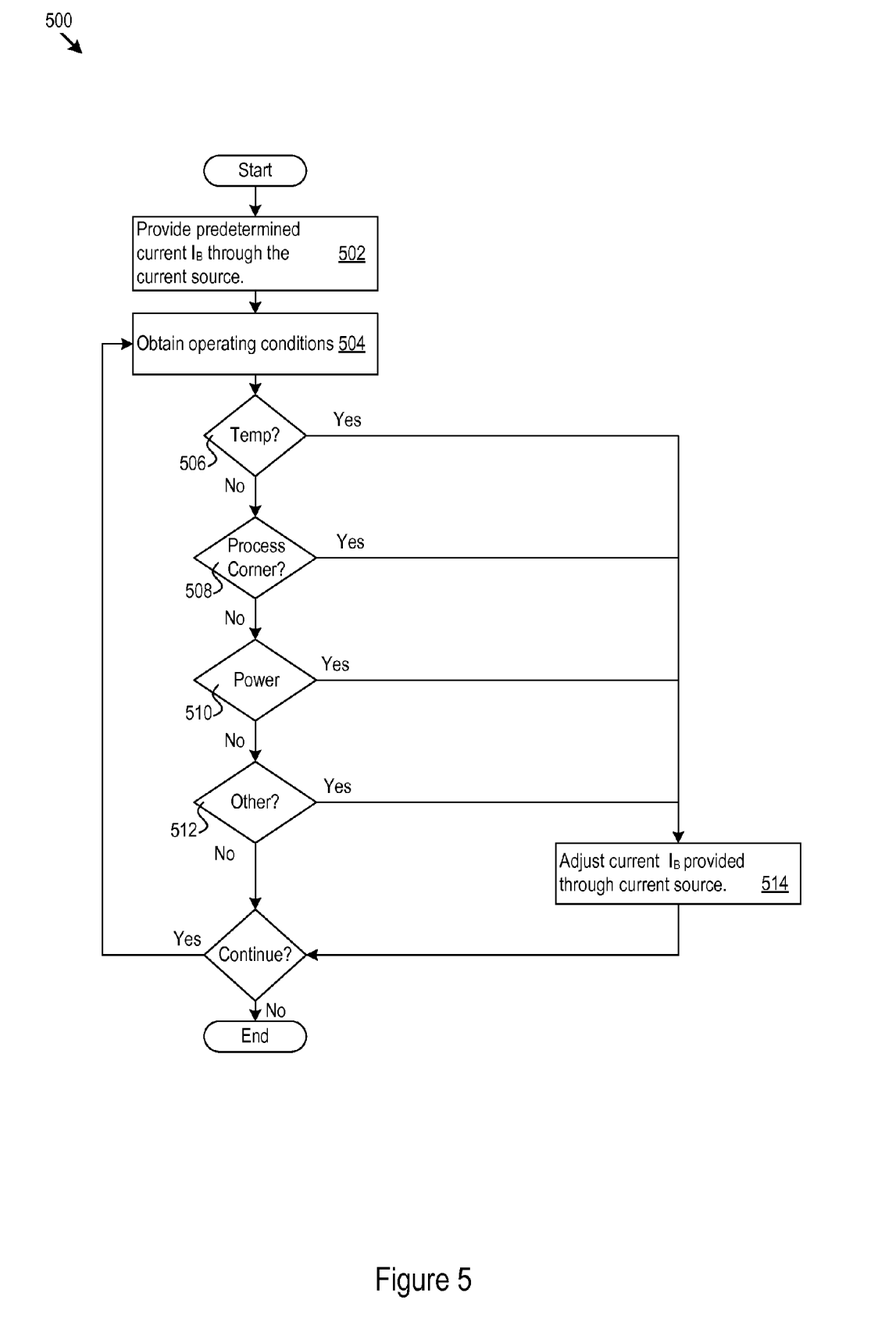
FIG. 5 shows an example of logic for adjusting bias conditions.

FIG. 5 shows an example of logic 500 for adjusting the current $I_B$ supplied to the replicate structure 120. For example, the current adjustment logic 410 may implement the logic 500 as hardware, software, or firmware. The current adjustment logic 410 may provide a predetermined current $I_B$ through the current source 130 (502). The predetermined current may be an initial current or default current supplied by the current source 130, e.g., as determined during simulations as described above. In some implementations, the current adjustment logic 410 may take no action to provide the default current $I_B$ when the current source 130 is preconfigured to provide the default current $I_B$.

The current adjustment logic 410 obtains the operation conditions of the biasing circuit 400, the circuit block 110, or particular portions thereof (504), including any of the above-described operating conditions. The current adjustment logic 410 determines whether a change in operating condition has occurred, such as any combination of change in temperature (506), change to operation in a different process corner (508), a change in operating power (510), or any other condition changes (512). In response to an identified change, the current adjustment logic 410 adjusts the current $I_B$ provided through the current source 130 (514). In doing so, the current adjustment logic 410 adjusts the current $I_A$ provided to the circuit block 110. As discussed above, the current adjustment logic 410 may access a current adjustment table 414 to determine a particular current $I_B$ to provide through the current source 130 according to the obtained set of operating conditions. Thus the current adjustment logic 410 may dynamically control the bias conditions applied to the circuit block 110.

Figure 6:
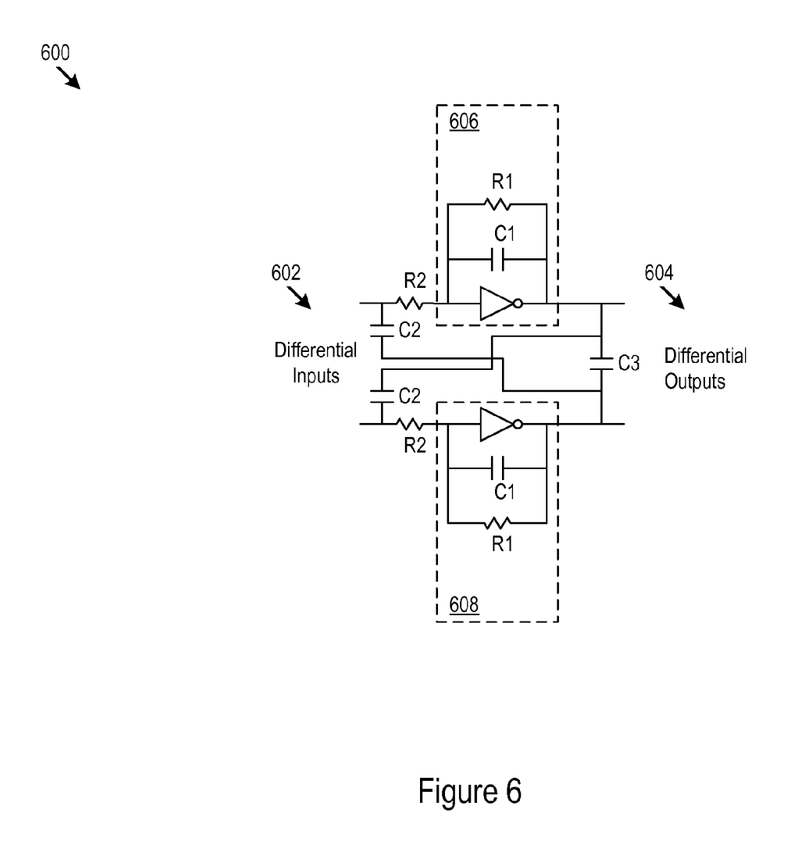
FIG. 6 shows an example of an inverter based complex low pass filter.

FIG. 6 shows an example of an inverter based complex low pass filter 600 (LPF 600). The LPF 600 includes differential inputs 602 and differential outputs 604. The differential inputs 602 connect to cross coupled inverter LPF structures 606 and 608. The LPF structures are cross-coupled using the input resistors R2 and capacitors C2, and the output capacitor C3.

The LPF 600 converts input current to a voltage while providing low pass filtering of the input signal. The LPF 600 has the inputs and outputs connected in a complex feedback manner to implement a sharp cutoff filter response. The sharp cutoff improves both in-band and out-of-band rejection, which is important for transmitting under a protocol (e.g., Bluetooth) with nearby adjacent bands, or whenever adjacent channel spurious content and noise must be below specified limits.

Either or both of the LPF structures 606 and 608 may be biased by a biasing circuit such as that described above. The biasing circuits facilitate PVT insensitive operation of the LPF 600, and improved compliance with specified design goals (e.g. filter response and out-of-band spectral emissions). In other words, the power supplies (e.g., voltage, current, or both) of the inverters in the LPF structures 606 and 608 may be provided by the biasing circuit 100 or 400. As a result, even at different process, voltage, and temperature points, the inverters still operate in their desired modes to provide linear signal conversion.

When both LPF structures 606 and 608 will be subject to the same bias conditions, then both the inverters in the LPF structures 606 and 608 may receive their voltage and current supplies from the same bias circuitry 100/400. In that case, the replicate circuit 120 may include a unit cell for one of the invertors, or multiple unit cells, e.g., two cells, one for each inverter in the LPF 600. The bias circuit 100/400 is then configured to provide a current and voltage that meets the performance characteristics desired from the LPF 600, as influenced and compensated by the replicate circuit 120.

Note that the values of R1, R2, C1, C2, and C3 may vary widely to implement any particular filter bandwidth requirement and filter characteristic. For example, the component values for R1, R2, C1, and C2 may be chosen to implement a specific bandwidth while meeting a particular in-band rejection requirement. The value for C3 may be chosen for a specified out-of-band rejection requirement. Further, the LPF 600 may include programmable resistors and capacitors so that, e.g., the values of C1 and C2 may be modified dynamically to implement programmable filter characteristics.

The LPF 600 has a lower thermal noise contribution due to the absence of an op amp, and that out-of-band noise is reduced. The LPF also has a relatively high operating bandwidth (e.g., 7 MHz), while sharply reducing in-band spurious noise levels. Furthermore, the LPF 600 exhibits reduced current consumption because it does not use an op amp.

In some implementations, the LPF 600 may be implemented as part of communication circuitry, such as for performing Bluetooth communications or according to any number of additional or alternative communication protocols, techniques, or standards. The filter bandwidth of the LPF 600 may be adjusted based on various configuration or implementation parameters, including by adjusting the values of one or more programmable resistor or capacitor values. Doing so may allow the LPF 600 to cover larger or smaller bandwidth ranges as specified for a particular communication standard. In some implementations, the LFP 600 is configured such that the bandwidth range is set to 1 Mhz-7 Mhz, with a typical, normal, or default bandwidth at 2.5 Mhz. In this implementation, the in-band rejection may be set to 5 decibels (dB) at 3 Mhz offset and to −35 dB rejection at 15 Mhz offset. As one exemplary configuration, the capacitor C1 may be set to 6.1 picofarads (pF), capacitor C2 may be set to 4.1 pF, capacitor C3 may be set to 10 pF, resistor R1 may be set to 8 kilo*(k) Ohms, and resistor R2 may be set to 3 k Ohms.

Figure 7:
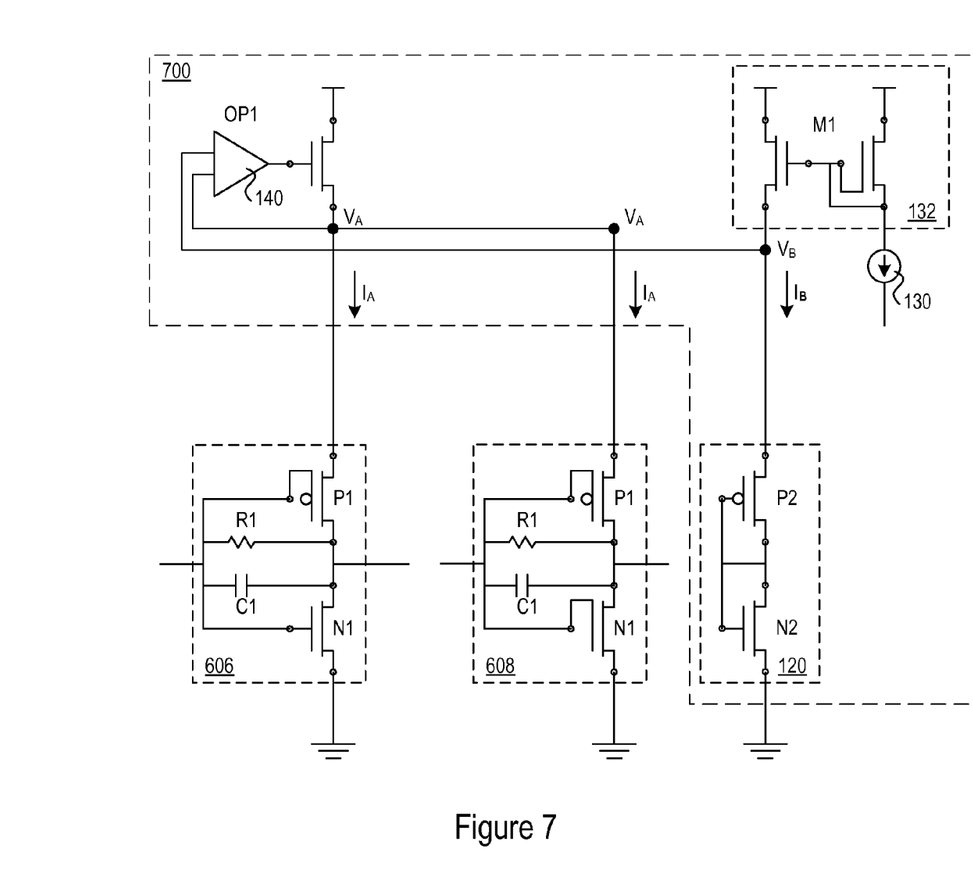
FIG. 7 shows an example of a biasing circuit for a circuit block with multiple inverters.

FIG. 7 shows an example of a biasing circuit 700 for a circuit block 110 with multiple inverters. For instance, the circuit block 110 may include a complex LPF with multiple inverters, such as the LPF 600. In FIG. 7, the biasing circuit 100 provides a supply voltage and a target supply current $I_A$ to both of the LPF structures 606 and 608 of the LPF, which each include an inverter. In FIG. 7, the output of the op amp 140 drives the supply voltage for each of the LPF structures 606 and 608. Each of the transistor sections P1-N1 of the LPF structures 606 and 608 may share a common w/l ratio that is proportional to the w/l ratio of the transistor section P2-N2 of the replicate circuit 120. Accordingly, the biasing circuit 700 may provide the target current $I_A$ to both the LFP structures 606 and 608, thus ensuring functionality of the LPF structures 606, 608, and/or 600 according to one or more performance criteria. A consistent structure of the biasing circuit 700 may be employed to provide a target supply current $I_A$ to a circuit block 110 with any number of inverters and corresponding transistor sections.

Figure 8:
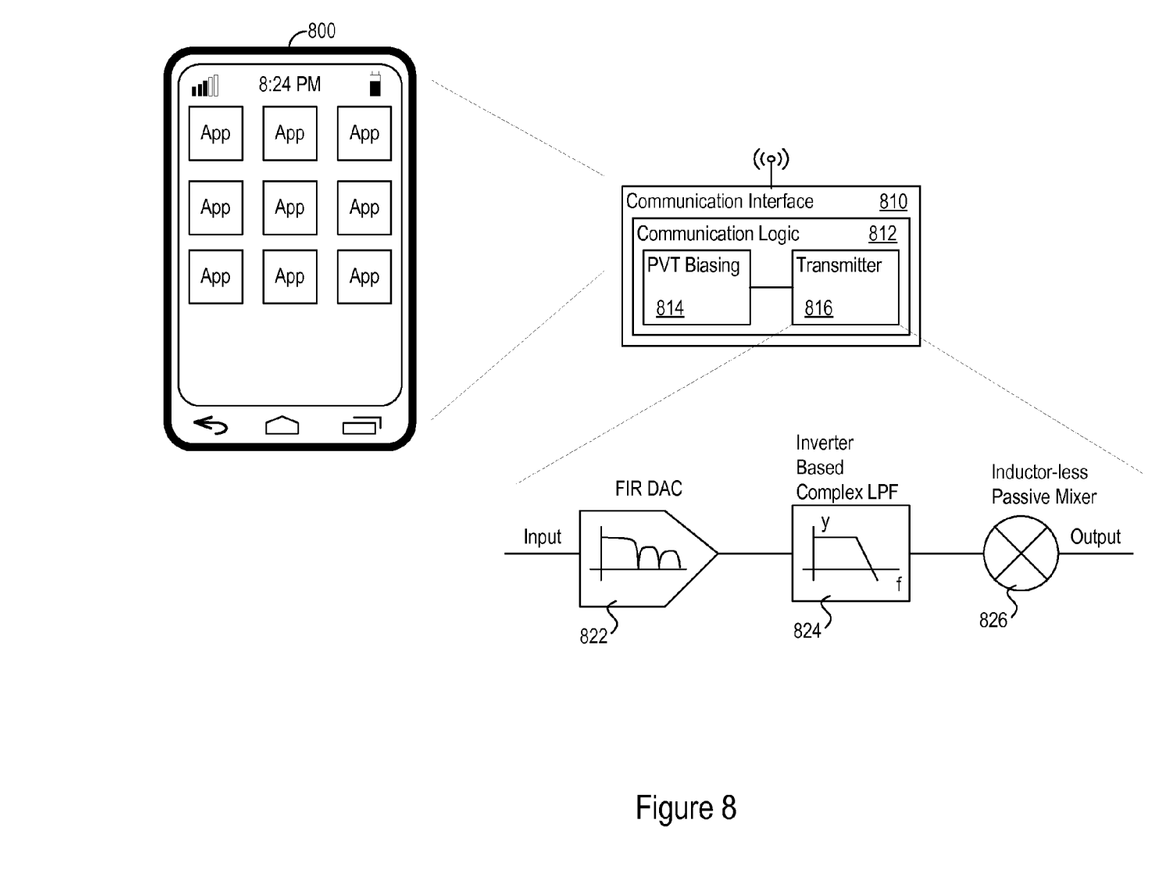
FIG. 8 shows an example of a communication device employing a biasing circuit.

FIG. 8 shows an example of a communication device 800 employing a biasing circuit. The device 800 may be a smart phone, laptop computer, automobile entertainment system, or any other communication device. The communication device 800 includes a communication interface 810 for sending and receiving data.

The communication interface 810 may be implemented with many different types of communication logic 812. The communication logic 812 may include, as examples, transmitters, antennas, amplifiers, mixers, filters, and other logic that forms a transmit or receive signal processing chain. The communication interface may be a Bluetooth™ interface, WiFi interface, 3G/4G/LTE interface, or another type of interface.

The communication logic 812 may also include a biasing circuit 814 that may be implemented as shown in FIGS. 1 and 4, as examples. In the example of FIG. 8, the biasing circuit 814 provides current, voltage, or both to a transmitter 816. The transmitter may include a digital to analog converter (DAC) 822, a LPF 824, and a mixer 826. In particular, the biasing circuit 714 may provide current and voltage to the LPF 824, which may be implemented as the LPF 200 or 600.

The transmitter 816 meets customer specifications for in-band spurious and out-of-band noise reduction. The improved biasing of the LPF 824 permits the transmitter 816 to operate without elevated orders of active filtering, while still producing a sharp frequency cutoff. As a result, the transmitter 816 has less thermal noise at frequency bands that are in the receive band and that would result in decreased receiver sensitivity.

In the transmitter 816, the filtering function distributed between the DAC 822, which may be a finite impulse response (FIR) DAC, and the LFP 824, which may be a low order inverter based complex filter. The LPF 824 may be a second order low pass filter, for example. This distributed implementation provides sharp cutoff for in-band response and reduced out-of-band noise levels, because no active structures (e.g., op amps) are needed. The biasing circuit 714 may implement (e.g., in the current adjustment logic 410) a temperature controlled algorithm to facilitate linear operation over process corners and temperature with a filter bandwidth of 5 Mhz of more. Note also that the transmitter 816 may implement a passive mixer 826 (that may also omit inductors) to up-convert the low frequency signal our of the LPF 824 to the radio frequency (RF) domain. The passive mixer 826 further reduces the current consumption.

In general, the transmitter 816 may have lower thermal noise due to the absence of op amp circuits in the low pass filter. At the same time, both in-band and out-of-band components are significantly rejected for noise reduction. The combination of the FIR DAC and complex filter structure 824 help achieve this result. Further, the transmitter 816 may have low current consumption due to the absence of op amps in the LPF 824, and use of the passive mixer 826. The LPF 824 provides current to voltage conversion with sustained linearity, and produces high voltage swing levels, so that the passive mixer 826 may be used (without inductors) to perform the mixing function without requiring an active mixer.

In some implementations of the transmitter 816, the FIR DAC 822 is implemented as a four tap FIR filter. The weighting factors of the four taps may be set to 0.15, 0.35, 0.35, and 0.15 respectively. The LPF 824 may be implemented as the LPF 600, and include the capacitor and resistor values discussed above. The passive mixer 826 may be implemented with MOS devices to sufficiently drive the next stage of processing (e.g., of a particular voltage or voltage swing level) while ensuring the load on the LPF 824 does not exceed a particular threshold. For example, MOS devices of the passive mixer 826 may be implemented with a channel width of 8 micrometers (um) and a channel length of 0.03 um, for example.

The communication logic 810, with a reduced number of op-amps and distributed filtering, may reduce the generation of thermal noise as compared to op amp based designs (e.g., of low pass filters) while still rejecting in-band and out-of-band noise for noise rejection. The communication logic 810 may also consume less current than op-amp based designs, allowing more efficient operation.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A device comprising:
a digital to analog converter configured to generate an analog baseband signal meeting a performance requirement outside of a predetermined frequency range;
an inverter-based low pass filter comprising multiple inverters, the inverter-based low pass filter configured to:
receive the analog baseband signal; and
filter the analog baseband signal for noise rejection outside the predetermined frequency range; and
biasing logic configured to supply a target current to the inverter-based low pass filter such that the inverter-based low pass filter meets a performance criterion.

2. The device of claim 1, where the performance criterion comprises a linearity requirement for the inverter-based low pass filter; and
where the biasing logic is configured to supply the target current such that the inverter-based low pass filter meets the performance criterion when operating in a particular temperature range.

3. The device of claim 1, where the performance criterion comprises a linearity requirement for the inverter-based low pass filter; and
where the biasing logic is configured to supply the target current such that the inverter-based low pass filter meets the performance criterion when operating at a particular process corner.

4. The device of claim 1, where the performance criterion comprises a linearity requirement for an inverter of the inverter-based low pass filter; and where the biasing logic is configured to supply the target current such that the inverter-based low pass filter meets the performance criterion when a particular voltage is supplied to the inverter-based low pass filter.

5. The device of claim 1, further comprising
a passive mixer configured to:
receive a filtered analog baseband signal from the inverter-based low pass filter; and
mix the filtered analog baseband signal without consuming power from an external power source.

6. The device of claim 1, where the biasing logic comprises a replicate circuit comprising a transistor section with a width/length ratio proportional to a width/length ratio of a transistor section of the inverter-based low pass filter such that the target current is proportional to a replicate current that flows through replicate circuit.

7. The device of claim 6, where the biasing logic is configured to supply the target current to the inverter-based low pass filter by:
supplying the replicate current to the replicate circuit; and
matching a voltage of the inverter-based low pass filter with a voltage of the replicate circuit to force the target current through the inverter-based low pass filter.

8. A device comprising:
a digital to analog converter configured to generate an analog baseband signal meeting a performance requirement outside of a predetermined frequency range;
an inverter-based low pass filter comprising an inverter, the inverter-based low pass filter configured to:
receive the analog baseband signal; and
filter the analog baseband signal for noise rejection outside the predetermined frequency range; and
biasing logic configured to supply a target current to the inverter-based low pass filter such that the low pass filter meets a linearity requirement for processing the analog baseband signal; and
current adjustment logic configured to adjust the target current supplied to the inverter-based low pass filter in response to a change in an operating condition of the inverter-based low pass filter.

9. The device of claim 8, where the current adjustment logic is configured to determine a change in temperature of the inverter-based low pass filter, and in response:
adjust the target current supplied to the inverter-based low pass filter when the change in temperature causes the inverter to fail the linearity requirement.

10. The device of claim 8, where the current adjustment logic is configured to determine a change in a process corner the inverter-based low pass filter is operating in, and in response:
adjust the target current supplied to the inverter-based low pass filter when the change in the process corner causes the inverter to fail the linearity requirement.

11. The device of claim 8, where the current adjustment logic is configured to determine a change in a supply voltage that the inverter-based low pass filter receives, and in response:
adjust the target current supplied to the inverter-based low pass filter when the change in the voltage causes the inverter to fail the linearity requirement.

12. The device of claim 8, further comprising
a passive mixer configured to:
receive a filtered analog baseband signal from the inverter-based low pass filter; and
mix the filtered analog baseband signal without increasing a voltage swing of the filtered analog baseband signal.

13. The device of claim 8, where the biasing logic comprises a replicate circuit with a transistor characteristic proportional to a transistor characteristic of an inverter in the inverter-based low pass filter such that the target current is proportional to a replicate current that flows through replicate circuit.

14. The device of claim 13, where the biasing logic is configured to supply the target current to the inverter-based low pass filter by:
   supplying the replicate current to the replicate circuit; and
   matching a voltage of the inverter-based low pass filter with a voltage of the replicate circuit to force the target current through the inverter based low pass filter.

15. A method comprising:
   through communication logic of a communication device:
      converting a digital baseband signal to an analog baseband signal through a digital-to-analog converter, where converting comprises:
         filtering noise outside of a predetermined frequency band through the digital-to-analog converter;
      providing a bias current to an inverter-based low pass filter such that the inverter-based low pass filter satisfies a performance criterion for communicating the analog baseband signal, where the performance criterion comprises a linearity requirement of an inverter in the inverter-based low pass filter;
      obtaining a filtered analog baseband signal by filtering the analog baseband signal through the inverter-based low pass filter; and
      mixing the filtered analog baseband signal without increasing a voltage swing of the filtered analog baseband signal.

16. The method of claim 15, where mixing the filtered analog baseband signal without increasing a voltage swing comprises:
   mixing the filtered analog baseband signal through a passive mixer that does not include an inductor for increasing the voltage swing.

17. The method of claim 15, where filtering noise outside of a predetermined frequency band through the digital-to-analog converter comprises:
   filtering the noise outside of the predetermined frequency band through a field impulse response digital-to-analog converter.

18. The method of claim 15, where providing the bias current to the inverter-based low pass filter comprises:
   providing a replicate current through a replicate circuit;
   forcing the bias current to flow through inverter-based low pass filter where the replicate current is proportional to the bias current.

19. The method of claim 18, where forcing the bias current to flow through inverter-based low pass filter comprises utilizing an op amp to ensure a voltage of the inverter-based low pass filter is the same as a voltage of the replicate circuit.

20. The method of claim 15, further comprising:
   determining, as the bias current, a minimum current to supply to the inverter-based low pass filter that satisfies the performance criterion for communicating the analog baseband signal.

\* \* \* \* \*